(12) United States Patent
Wang et al.

(10) Patent No.: US 10,651,377 B2
(45) Date of Patent: May 12, 2020

(54) STORAGE ELEMENT, STORAGE DEVICE, METHOD FOR MANUFACTURING THE SAME AND DRIVING METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Ruiyong Wang, Beijing (CN); Lianjie Qu, Beijing (CN); Ruizhi Yang, Beijing (CN); Yang You, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/054,821

(22) Filed: Aug. 3, 2018

(65) Prior Publication Data
US 2019/0097131 A1  Mar. 28, 2019

(30) Foreign Application Priority Data
Sep. 28, 2017 (CN) .......................... 2017 1 0897335

(51) Int. Cl.
*H01L 45/00* (2006.01)
*H01L 27/24* (2006.01)
(Continued)

(52) U.S. Cl.
CPC ...... *H01L 45/1206* (2013.01); *H01L 27/2436* (2013.01); *H01L 27/2463* (2013.01); *H01L 29/41733* (2013.01); *H01L 29/66765* (2013.01); *H01L 29/78678* (2013.01); *H01L 45/06* (2013.01); *H01L 45/1233* (2013.01); *H01L 45/1246* (2013.01); *H01L 45/1253* (2013.01); *H01L 45/144* (2013.01);
(Continued)

(58) Field of Classification Search
CPC ....................................................... H01L 45/00
See application file for complete search history.

(56) References Cited

U.S. PATENT DOCUMENTS

2004/0258866 A1* 12/2004 Shiba ................... G09G 3/2011
428/35.7
2009/0072215 A1   3/2009 Lung et al.
(Continued)

FOREIGN PATENT DOCUMENTS

CN         1573844 A      2/2005
CN       101057329 A    10/2007
(Continued)

OTHER PUBLICATIONS

First Office Action for Chinese Application No. 201710897335.1, dated Oct. 11, 2019, 6 Pages.

*Primary Examiner* — Thao P Le
(74) *Attorney, Agent, or Firm* — Brooks Kushman P.C.

(57) ABSTRACT

The present disclosure provides a storage element, a storage device, a method for manufacturing the same and a driving method. The method for manufacturing the storage element includes: providing a substrate; preparing a thin film transistor on the substrate; and preparing a storage functional pattern by using a phase change material, in which the storage functional pattern is connected to a drain electrode of the thin film transistor.

20 Claims, 5 Drawing Sheets

(51) Int. Cl.
*H01L 29/417* (2006.01)
*H01L 29/786* (2006.01)
*H01L 29/66* (2006.01)

(52) U.S. Cl.
CPC .......... *H01L 45/145* (2013.01); *H01L 45/146* (2013.01); *H01L 45/16* (2013.01); *H01L 45/1608* (2013.01); *H01L 45/1675* (2013.01); *H01L 29/6675* (2013.01)

(56) References Cited

U.S. PATENT DOCUMENTS

2010/0127271 A1\* 5/2010 Daniel .................. H01L 27/283
257/72
2016/0072063 A1 3/2016 Liu et al.

FOREIGN PATENT DOCUMENTS

| CN | 101677080 A | 3/2010 |
| CN | 105575991 A | 5/2016 |
| KR | 20090006452 A | 1/2009 |

\* cited by examiner

STORAGE ELEMENT, STORAGE DEVICE, METHOD FOR MANUFACTURING THE SAME AND DRIVING METHOD

CROSS-REFERENCE TO RELATED APPLICATION

This application claims priority to Chinese Patent Application No. 201710897335.1 filed on Sep. 28, 2017, which is incorporated herein by reference in its entirety.

TECHNICAL FIELD

The present disclosure relates to the field of a storage element, in particular to a storage element, a storage device, a method for manufacturing the same and a driving method.

BACKGROUND

In the related art, the storage element applied on a substrate generally includes a separate structure prepared based on silicon wafer. Thus, the manufacturing cost is high and the manufacturing process is complicated, and the integrated control in an array manner cannot be realized. In addition, this type of storage element requires high power consumption, and especially requires a relative high driving current for performing data reading, writing and erasing.

In view of this, there is an urgent need for a completely new solution capable of solving a series of problems of the storage elements in the related art described above.

SUMMARY

In one aspect, an embodiment of the present disclosure provides a method for manufacturing a storage element, which includes:

providing a substrate;

preparing a thin film transistor on the substrate; and preparing a storage functional pattern by using a phase change material, in which the storage functional pattern is connected to a drain electrode of the thin film transistor.

Optionally, the step of preparing the thin film transistor on the substrate includes:

preparing a source electrode, a drain electrode, and an insulating layer covering the source electrode and the drain electrode of the thin film transistor on the substrate, in which the insulating layer has a via hole exposing the drain electrode, and a pore size of the via hole is of submicron-scale; and the step of preparing the storage functional pattern by using the phase change material comprises:

preparing the storage functional pattern by using the phase change material after preparing the insulating layer, in which the storage functional pattern is connected to the drain electrode through the via hole of the insulating layer.

Optionally, the preparing the insulating layer having the via hole includes:

forming the insulating layer covering the source electrode and the drain electrode after preparing the source electrode and the drain electrode;

forming a first functional layer on the insulating layer and etching the first functional layer to form a first transition via hole corresponding to the drain electrode;

depositing a second functional layer covering the first transition via hole by vapor deposition, in which a cavity is formed in an interior of a portion of the second functional layer covering the first transition via hole;

etching the second functional layer to retain a portion of the second functional layer formed at an inner wall of the first transition via hole as an etch residual pattern, in which the etch residual pattern comprises a second transition via hole exposing a portion of the insulating layer and corresponding to the drain electrode;

etching the insulating layer by using the first functional layer and the etch residual pattern as a mask, to form the via hole of submicron-scale exposing the drain electrode; and removing the first functional layer and the etch residual pattern.

Optionally, the step of forming the first functional layer on the insulating layer and etching the first functional layer to form the first transition via hole corresponding to the drain electrode includes:

depositing a photosensitive resin material on the insulating layer to form the first functional layer, in which a thickness of the first functional layer is 100 nm to 3000 nm; and exposing and developing the first functional layer to form the first transition via hole corresponding to the drain electrode, in which a pore size of the first transition via hole is 1 μm to 3 μm.

Optionally, the step of depositing the second functional layer covering the first transition via hole by vapor deposition includes:

depositing a polysilicon material by vapor deposition in a deposition rate of 50 nm/min to 200 nm/min at a temperature of 100° C. to 300° C. under a vacuum of 1 mPa to 1000 mPa, to form the second functional layer, in which a thickness of the second functional layer is greater than or equal to 200 nm.

Optionally, the step of etching the second functional layer includes:

dry etching the second functional layer by using sulfur hexafluoride gas or chlorine gas to form the etch residual pattern having the second transition via hole of submicron-scale.

In another aspect, an embodiment of the present disclosure further provides a storage element, which includes:

a thin film transistor; and a storage functional pattern formed of a phase change material, in which the storage functional pattern is connected to a drain electrode of the thin film transistor.

Optionally, the thin film transistor comprises: a source electrode, a drain electrode, and an insulating layer covering the source electrode and the drain electrode, in which the insulating layer has a via hole exposing the drain electrode, and a pore size of the via hole is of submicron-scale; and the storage functional pattern is connected to the drain electrode through the via hole of the insulating layer.

Optionally, a cross-sectional area of the via hole in a direction parallel to the insulating layer is less than or equal to 1 μm².

Optionally, a thickness of the storage functional pattern is 100 nm to 1000 nm.

Optionally, the phase change material is chalcogenide or vanadium oxide.

In addition, another embodiment of the present disclosure further provides a storage device, which includes:

a plurality of storage elements provided by the present disclosure arranged in an array, in which the thin film transistor of the storage element comprises a source electrode, a drain electrode and a gate electrode;

a plurality of first signal lines, in which each of the first signal lines is connected to the gate electrode of the thin film transistor in at least one of the storage elements;

a plurality of second signal lines, in which each of the second signal lines is connected to the source electrode of the thin film transistor in at least one of the storage elements;

a plurality of third signal lines, in which each of the third signal lines is connected to the storage functional pattern in at least one of the storage elements; and a controller configured to load signals to the plurality of first signal lines, the plurality of second signal lines, and the plurality of third signal lines and to acquire information of a current in the plurality of third signal lines.

In addition, another embodiment of the present disclosure further provides a method for manufacturing a storage device, which includes:

manufacturing a plurality of storage elements arranged in an array on a base substrate according to the method provided by the present disclosure, in which the thin film transistor of the storage element comprises a source electrode, a drain electrode and a gate electrode;

forming a plurality of first signal lines, in which each of the first signal lines is connected to the gate electrode in at least one of the storage elements;

forming a plurality of second signal lines, in which each of the second signal lines is connected to the source electrode in at least one of the storage elements; and forming a plurality of third signal lines, in which each of the third signal lines is connected to the storage functional pattern in at least one of the storage elements.

In addition, another embodiment of the present disclosure further provides a method for driving a storage device using the storage device provided by the present disclosure, which includes:

loading a first signal to the first signal line, to turn on a link between the source electrode and the drain electrode of the storage element corresponding to the first signal line;

loading a second signal to the second signal line, such that the second signal flows from the source electrode of the storage element corresponding to the second signal line to the storage functional pattern connected to the drain electrode of the corresponding storage element, to allow the storage functional pattern to have one of the following phenomena: a conversion from an amorphous state to a crystalline state, a maintenance of the crystalline state, and a conversion from the crystalline state to the amorphous state; and loading a third signal to the third signal line, to acquire information about a current in the third signal line when the third signal is loaded, and to acquire information stored in the storage functional pattern based on the information of the current in the third signal line.

Optionally, the second signal comprises a first pulse signal, a second pulse signal and a third pulse signal, and the step of loading the second signal to the second signal line includes:

loading the first pulse signal to the second signal line when the link between the source electrode and the drain electrode of the storage element is turned on, to convert the storage functional pattern from the amorphous state to the crystalline state, and to realize a writing function of the storage functional pattern;

loading the second pulse signal to the second signal line when the link between the source electrode and the drain electrode of the storage element is turned on, to maintain the storage functional pattern in the crystalline state, and to realize a reading function of the storage functional pattern; and loading the third pulse signal to the second signal line when the link between the source electrode and the drain electrode of the storage element is turned on, to convert the storage functional pattern from the crystalline state to the amorphous state, and to realize an erasing function of the storage functional pattern;

in which a potential of the second pulse signal is lower than a potential of the first pulse signal, and the potential of the first pulse signal is lower than a potential of the third pulse signal.

Optionally, during the storage functional pattern is maintained in the crystalline state, the information about the current in the third signal line when the third signal is loaded is the information stored in the storage functional pattern.

DETAILED DESCRIPTION

The technical problems, the technical solutions, and the advantages of the present invention will be more clearly described in combination with the drawings and specific embodiments. In the following description, specific details such as specific configurations and components are merely provided to assist in a comprehensive understanding of the embodiments of the present disclosure. Therefore, it will be apparent to a person skilled in the art that various improvements and modifications may be made to the embodiments described herein without departing from the principle and spirit of the present disclosure. In addition, for clarity and conciseness, descriptions of known functions and constructions are omitted.

It should be understood that "one example" or "an example" referred throughout the specification means that particular features, structures, or characteristics related to the example are included in at least one example of the present disclosure. Thus, "in one example" or "in an example" recited throughout the specification does not necessarily refer to the same example. In addition, these particular features, structures, or characteristics may be combined in any suitable manner in one or more examples.

The present disclosure provides a solution to the problem in the related art that the storage elements are not easily integrated and the power consumption is high.

In one aspect, an example of the present disclosure provides a storage element, which includes:

a thin film transistor; and a storage functional pattern formed of a phase change material, in which the storage functional pattern is connected to a drain electrode of the thin film transistor.

The phase change material has a crystallization temperature. If the temperature is in the range of the crystallization temperature, the phase change material is in a crystalline state; and if the temperature is outside the range of the crystallization temperature, the phase change material is in an amorphous state.

The storage element of this example is manufactured based on a thin film transistor, and may be driven by using the thin film transistor as a switch. When the thin film transistor is turned on, the signal loaded by the source electrode may be transferred to the storage functional pattern through the drain electrode, thereby controlling the storage functional pattern to perform a conversion between the crystalline state and the amorphous state in an electrically heating manner, so that the resistance value of the storage functional pattern changes sharply to represent the stored data. In some applications, the storage elements of this example may be arranged massively in a matrix manner, and may achieve numerous combinations and a large-capacity storage based on the matrix-type control method for the thin film transistor in the related art.

Figure 1:
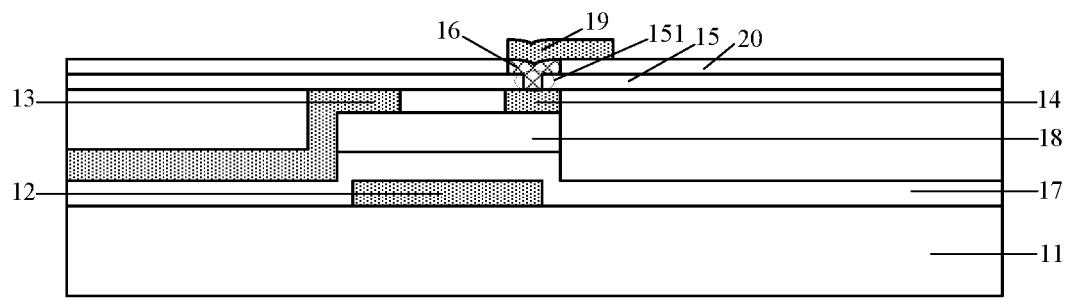
FIG. 1 is a schematic diagram of a storage element according to an embodiment of the present disclosure.

As an exemplary solution, a bottom-gate-type thin film transistor is taken. As shown in FIG. 1, the storage element of this example includes:

a thin film transistor formed on the substrate 11, and a storage functional pattern 16 formed of a phase change material, in which the thin film transistor comprises a gate electrode 12, a source electrode 13, a drain electrode 14, and an insulating layer 15 covering the source electrode 13 and the drain electrode 14, the insulating layer 15 has a via hole 151 exposing the drain electrode 14; and the storage functional pattern 16 is connected to the drain electrode 14 through the via hole 151 of the insulating layer 15.

Based on the above structure, after the thin film transistor is turned on, the signal loaded on the source electrode 13 may be transferred from the drain electrode 14 to the storage functional pattern 16 through the via hole 151 of the insulating layer 15.

As an exemplary solution, the pore size of the via hole 151 of this example is of submicron-scale (the internationally recognized submicron-scale space is 100 nm to 1000 nm), and the signal loaded on the source electrode 13 and passed through the via hole 151 of submicron-scale may heat the storage functional pattern 16 with a significantly increased effect, so that a signal having a small potential may be used to control the conversion of the storage functional pattern 16 between a crystalline state and an amorphous state, and the energy consumption for driving the storage element can be reduced.

The storage element of this example will be described in detail in combination with an application below.

Further referring to FIG. 1, the storage element in one application of this example may include:

a substrate 11, which is used as a base and may be one selected from a group consisting of a single layer of a glass, a single layer of a polyimide film, and a composite layer structure composed of a glass and a polyimide film;

a gate electrode 12 of the thin film transistor, which may be made of a metal material, and the metal material may be one selected from a group consisting of molybdenum, aluminum, and molybdenum aluminum alloy;

a gate insulating layer 17 of the thin film transistor, which may be made of an inorganic compound, and the inorganic compound may be a compound of nitrogen and silicon (for example, silicon nitride);

an active layer 18 of the thin film transistor, which may be made of a semiconductor material, and the semiconductor material may be one of or a combination of polysilicon, amorphous silicon and indium gallium zinc oxide;

a source electrode 13 and a drain electrode 14 of the thin film transistor, which may be made of a metal material, and the metal material may be one selected from a group consisting of titanium, aluminum, and titanium aluminum alloy;

an insulating layer 15, which may be made of an insulating material, and the insulating material may be a compound of nitrogen and silicon (such as silicon nitride) or a compound of oxygen and silicon (such as silicon oxide);

a storage functional pattern 16, which is made of a phase change material, and the phase change material may be chalcogenide such as $Ge_xBi_ySe_z$ (x, y, and z are reasonable positive integers) or GST ($Ge_2Sb_2Te_5$), or the phase change material may be vanadium oxide such as $VO_2$, and the thickness of the storage functional pattern 16 may be 100 nm to 1000 nm, for example, 150 nm;

an insulating material layer 20 covering the above insulating layer 15, which may be made of an inorganic compound, and the inorganic compound may be a compound of nitrogen and silicon such as silicon nitride; and an electrode 19, which is made of a conductive material, and the conductive material may be one selected from a group consisting of aluminum, molybdenum and titanium, or an alloy of at least two of aluminum, molybdenum and titanium.

Of course, it should be noted that the thin film transistor in the storage element of this example may also have a top-gate-type structure, in which the gate electrode is located above the source electrode and the drain electrode. The principle of the top-gate-type structure is the same with a bottom-gate-type structure, that is, both structures require a connection of the storage functional pattern with the drain electrode of the thin film transistor, so as to perform the three functions of writing, reading and erasing data through driving the storage functional pattern by the thin film transistor. Therefore, the detailed description of the top-gate-type structure will not be repeated herein.

Figure 2:
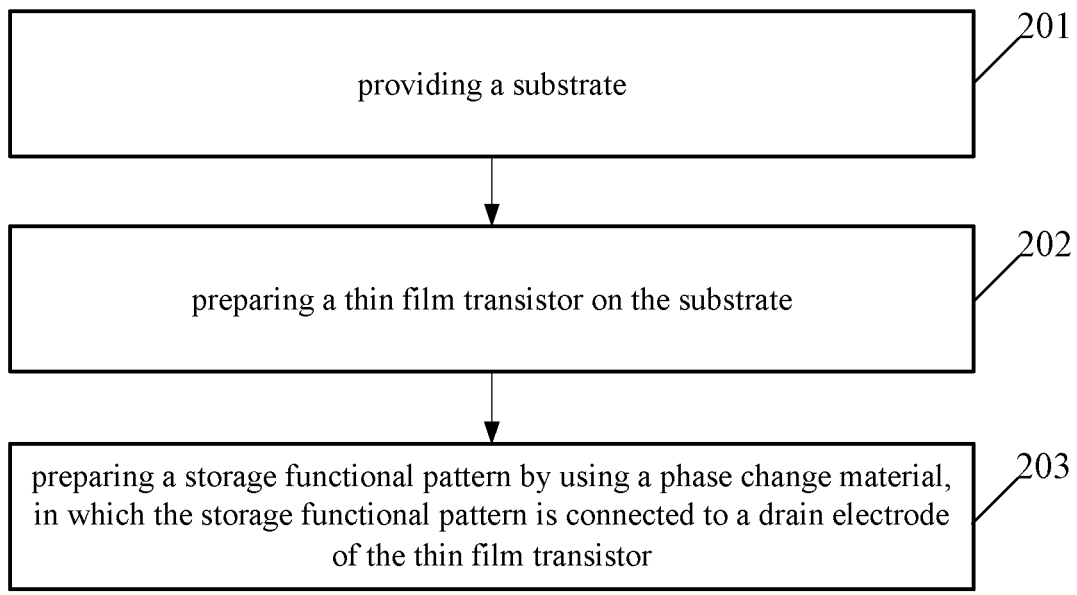
FIG. 2 is a flow chart of a method for manufacturing a storage element according to an embodiment of the present disclosure.

In another aspect, an example of the present disclosure further provides a method for manufacturing the above storage element, as shown in FIG. 2, which includes:

step 201 of providing a substrate;

step 202 of preparing a thin film transistor on the substrate; and step 203 of preparing a storage functional pattern by using a phase change material, in which the storage functional pattern is connected to a drain electrode of the thin film transistor.

The manufacturing method of this example is used to manufacture the above-described storage element provided by the present disclosure, thus obviously, the technical effects of the storage element may also be achieved by the manufacturing method of this example.

The manufacturing method of this example will be described in detail by way of example below.

In the manufacturing method of this example, patterns of the thin film transistor prepared on the substrate may mainly include a source electrode, a drain electrode, and an insulating layer covering the source electrode and the drain electrode of the thin film transistor, the insulating layer has a via hole exposing the drain electrode, and the pore size of the via hole may be of submicron-scale; and the storage functional pattern is prepared by using the phase change material after preparing the insulating layer, in which the storage functional pattern is connected to the drain electrode through the via hole of the insulating layer.

In this example, the signal loaded on the source electrode heats the storage functional pattern through the via pore of submicron-scale, so that the heating effect is remarkable. Based on the design of the via hole of submicron-scale, this example only needs to load a signal with a small potential on the source electrode so as to control the conversion of the storage functional pattern between a crystalline state and an amorphous state, thereby reducing the energy consumption for driving the storage element.

It should be noted here that etching a via hole of submicron-scale on the insulating layer may be very difficult based on the mask precision of the mask in the related art. In view of this, the present disclosure determines a feasible preparation process after repeated practices based on the mask etching technique in the related art. The preparation process of the via hole of submicron-scale will be described in detail by way of example below.

The step of forming the insulating layer having the via hole of submicron-scale may include the following steps.

Figure 3A:
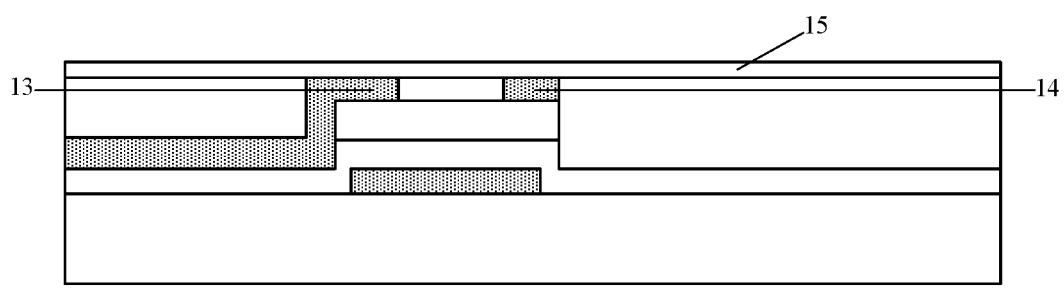
FIGS. 3A to 3F are schematic diagrams showing a process for manufacturing an insulating layer using a method for manufacturing a storage element according to an embodiment of the present disclosure.

Step A1, as shown in FIG. 3A, for preparing the source electrode 13 and the drain electrode 14 followed by forming an insulating layer 15 covering the source electrode 13 and the drain electrode 14.

Figure 3B:
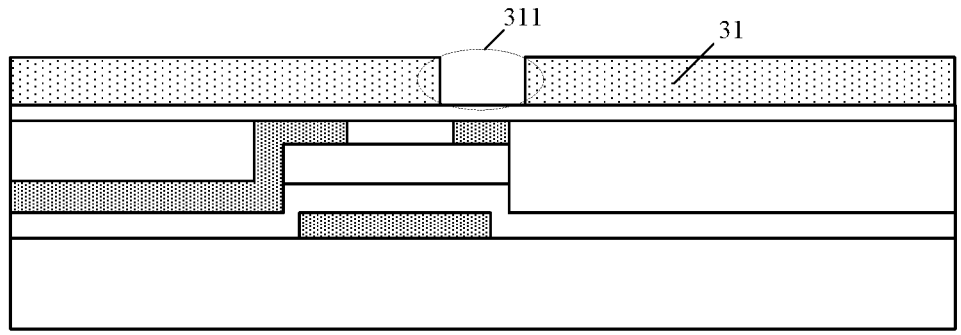

Step A2, as shown in FIG. 3B, for forming a first functional layer 31 on the insulating layer 15 and etching the first functional layer 31 to form a first transition via hole 311 corresponding to the drain electrode 14, in which the first transition via hole 311 exposes at least a portion of the drain electrode 14.

In some applications, the first functional layer 31 of step A2 may be formed of a photosensitive resin material and may have a thickness of 100 nm to 3000 nm. In the etching process, the photosensitive resin material may be exposed and developed by using a mask in the related art, thereby forming the first transition via hole 311.

It should be noted that, since the mask in the related art cannot provide submicron-scale mask precision, the pore size of the first transition via hole 311 manufactured in step A2 is not fined to submicron scale, but the pore size of the first transition via hole 311 is required to be 1 μm to 3 μm, for example 1.5 μm to 2 μm.

Figure 3C:
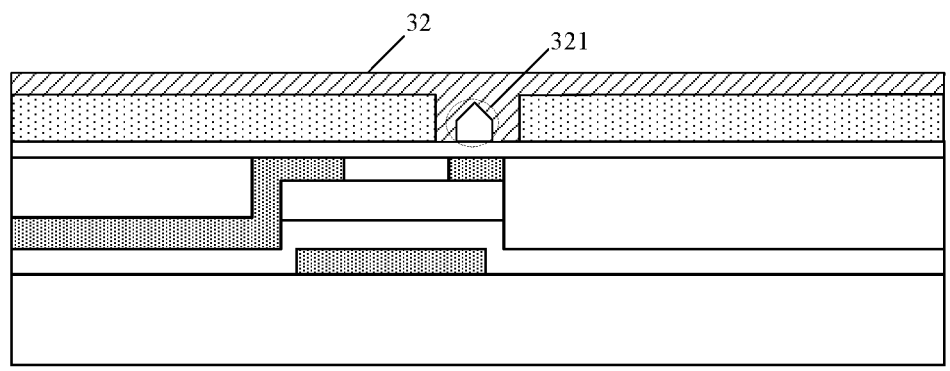

Step A3, as shown in FIG. 3C, for depositing a second functional layer 32 filling the first transition via hole 311 by vapor deposition, in which a cavity 321 is formed in the interior of the portion filling the first transition via hole 311.

In some applications, the second functional layer 32 of this step may be formed of a polysilicon material. For example, when being executed, a polysilicon material may be deposited by vapor deposition in a deposition rate of 50 nm/min to 200 nm/min at a temperature of 100° C. to 300° C. under a vacuum of 1 mPa to 1000 mPa, to form the second functional layer 32, in which the thickness of the second functional layer 32 is greater than or equal to 200 nm.

Figure 3D:
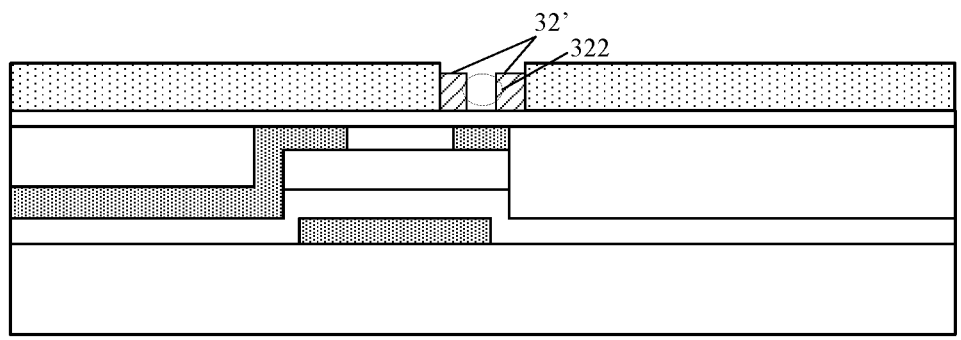

Step A4, as shown in FIG. 3D, for etching the second functional layer 32 to retain a portion of the second functional layer 32 formed at the inner wall of the first transition via hole 311 as an etch residual pattern 32', in which the etch residual pattern 32' is formed by the opening of the internal cavity 321 due to etching the portion of the second functional layer 32 filling the first transition via hole 311. As shown in FIG. 3D, the etch residual pattern 32' comprises a second transition via hole 322, the second transition via hole 322 exposes a portion of the insulating layer 15 and corresponds to the drain electrode 14, and the second transition via hole 322 is of submicron-scale.

In some applications, if the second functional layer 32 is formed of a polysilicon material, sulfur hexafluoride gas or chlorine gas may be used in step A4 to dry etch the second functional layer 32.

Figure 3E:
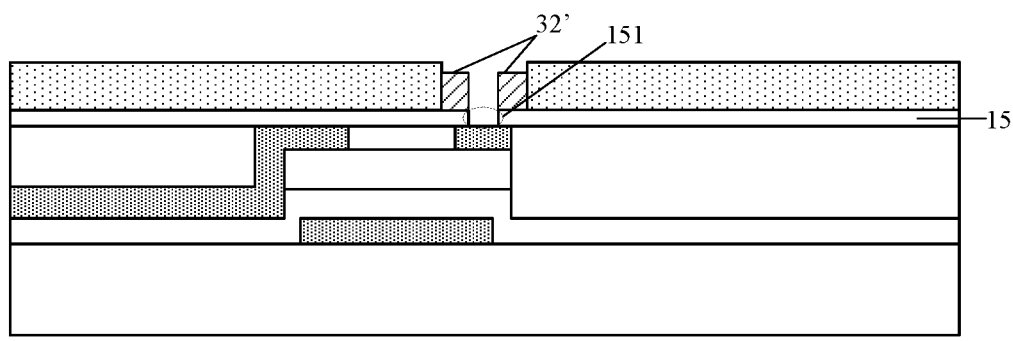

Step A5, as shown in FIG. 3E, for etching the insulating layer 15 by using the first functional layer 31 and the etch residual pattern 32' as a mask.

It can be seen that since the second transition via hole 322 of submicron-scale is finally formed in step A4, it is possible to etch a via hole 151 of submicron-scale on the insulating layer 15 based on the second transition via hole 322 in step A5.

Figure 3F:
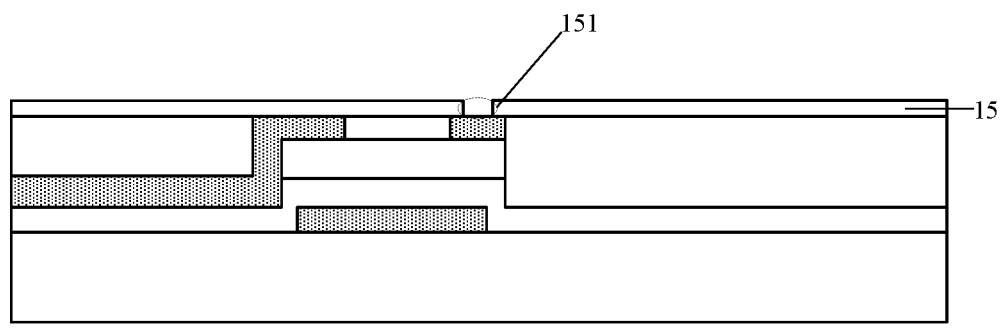

Step A6, for removing the first functional layer 31 and the etch residual pattern 32' to obtain a structure as shown in FIG. 3F.

In some applications, an organic strong alkali stripping solution may be used to immerse the substrate for 10 s to 60 s or to be sprayed on the substrate for 10 s to 60 s at a temperature of 20° C. to 30° C., to remove the first functional layer 31 and the etch residual pattern 32'.

Based on the above steps A1 to A6, the insulating layer 15 having the via hole 151 of submicron-scale may be finally obtained. Thereafter, in this example, a phase change material layer may be further formed on the insulating layer 15, and the phase change material layer may be formed by a patterning process into a storage functional pattern 16 connected to the drain electrode 14 through the via hole 151.

The above is the introduction of the manufacturing method of this example. It can be seen that the manufacturing method of this example may form a via hole of submicron-scale on the insulating layer by using a mask etching process, and the via hole of submicron-scale may be significantly increase the effect of the signal loaded on the source electrode 13 heating the storage functional pattern 16, and may reduce the energy consumption for driving the storage element.

Figure 4:
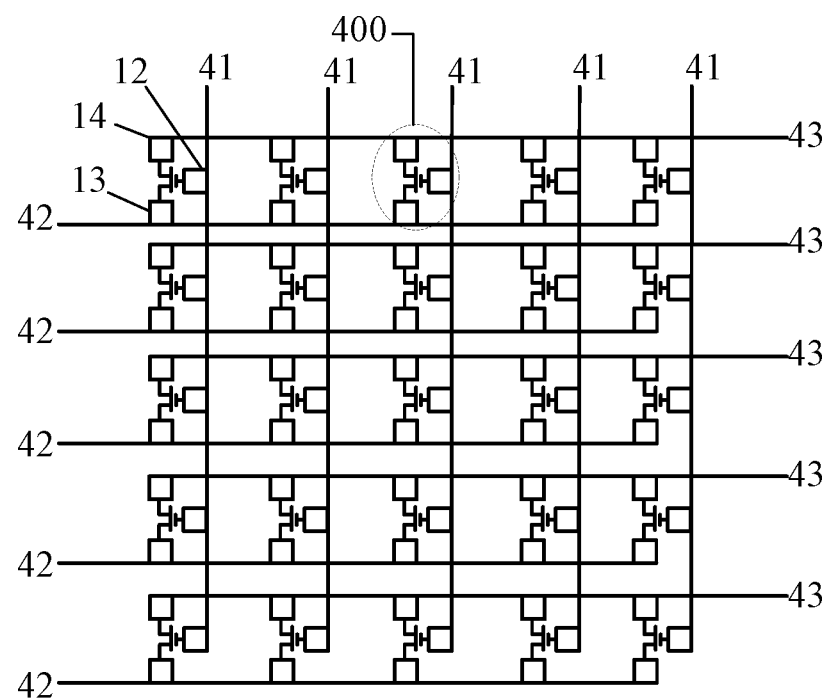
FIG. 4 is a schematic diagram of a storage device according to an embodiment of the present disclosure.

In addition, another example of the present disclosure further provides a storage device, as shown in FIG. 4, which includes:

a plurality of storage elements 400 provided by the above examples of the present disclosure arranged in an array;

a plurality of first signal lines 41, in which each of the first signal lines 41 is connected to the gate electrode 12 in at least one of the storage elements;

a plurality of second signal lines 42, in which each of the second signal lines 42 is connected to the source electrode 13 in at least one of the storage elements;

a plurality of third signal lines 43, in which each of the third signal lines 43 is connected to the storage functional pattern in at least one of the storage elements (indicated by the drain electrode 14 of the storage element in FIG. 4); and a controller (not shown in FIG. 4) configured to load signals to the plurality of first signal lines 41, the plurality of second signal lines 42, and the plurality of third signal lines 43 and to acquire information about a current in the plurality of third signal lines 43.

In the storage device of this example, the controller may load a first signal to the first signal line, so as to control the thin film transistor of the storage element to be turned on. After the thin film transistor is turned on, the controller loads a second signal to the second signal line, in which the second signal is used to control the conversion of the storage functional pattern of the storage element between a crystalline state and an amorphous state, and thus the resistance value will significantly changes, thereby corresponding to the functions of writing, reading and erasing data. For example, when the storage functional pattern is converted from an amorphous state to a crystalline state, it corresponds to a writing function. On the contrary, when the storage function pattern is converted from a crystalline state to an amorphous state, it corresponds to an erasing function. When the storage functional pattern maintains a crystalline state, it corresponds to a reading function.

Obviously, based on the structure shown in FIG. 4, the storage elements 400 are integrated in a matrix manner, and the processor may purposefully select signal lines to load the first signal and the second signal based on an addressing method of driving a signal line in the related art. Thus, a large number of repeated storage elements are controlled to be in a crystalline state or an amorphous state, so as to achieve a plurality of arrangements and combinations, which may be used for recording a large amount of data information and for realizing a large-capacity storage function.

Figure 5:
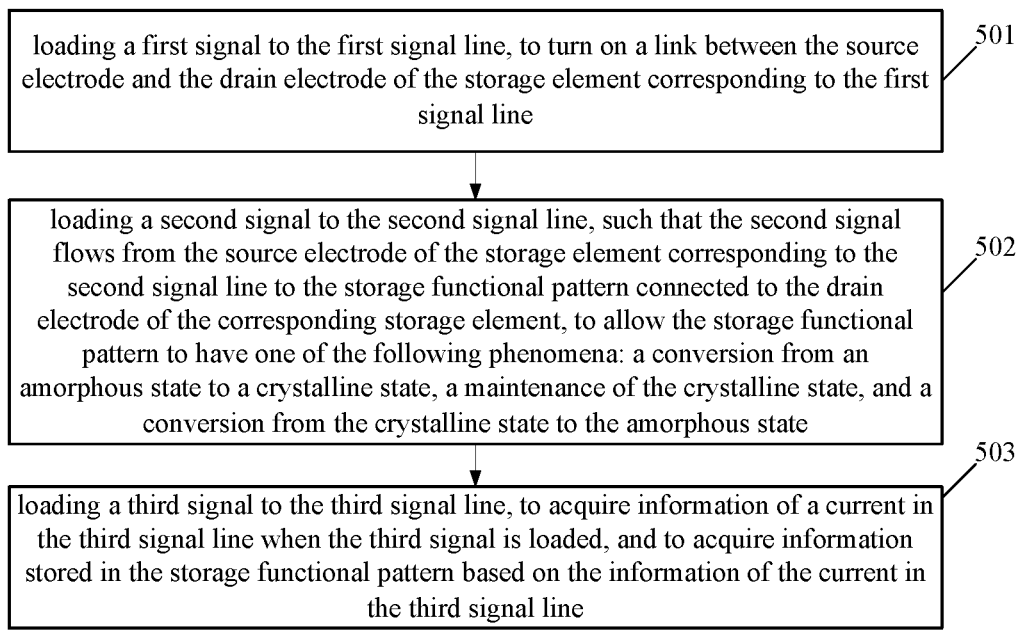
FIG. 5 is a schematic diagram of steps of a method for driving a storage device according to an embodiment of the present disclosure.

Correspondingly, another example of the present disclosure provides a method for driving the above storage device, as shown in FIG. 5, which includes:

step 501, for loading a first signal to the first signal line, to turn on a link between the source electrode and the drain electrode of the storage element corresponding to the first signal line;

step 502, for loading a second signal to the second signal line, such that the second signal flows from the source electrode of the storage element corresponding to the second signal line to the storage functional pattern connected to the drain electrode of the corresponding storage element, to allow the storage functional pattern to have one of the following phenomena: a conversion from an amorphous state to a crystalline state, a maintenance of the crystalline state, and a conversion from the crystalline state to the amorphous state; and step 503, for loading a third signal to the third signal line, to acquire information of a current in the third signal line when the third signal is loaded, and to acquire information stored in the storage functional pattern based on the information of the current in the third signal line.

The driving method of this example will be described in detail by way of example in combination with an application below.

Figure 6:
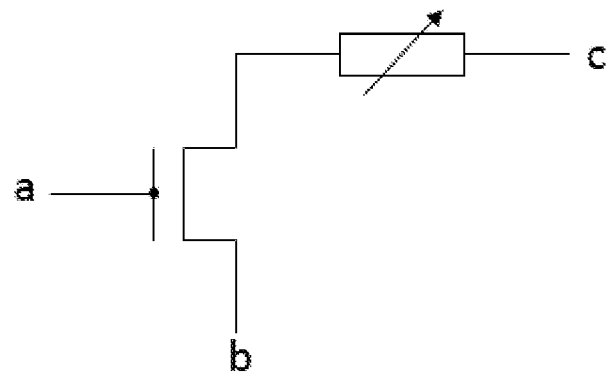
FIG. 6 is a schematic circuit diagram of a storage element in a storage device according to an embodiment of the present disclosure.

Referring to FIG. 6, FIG. 6 is a structural diagram of a circuit equivalent to a storage element of this example, in which a point a represents the potential of the gate electrode of the storage element, that is, the potential of the first signal loaded to the first signal line; a point b represents the potential of the source electrode of the storage element, that is, the potential of the second signal loaded to the second signal line; and a point c represents the potential of the drain electrode of the storage element, that is, the potential of the third signal loaded to the third signal line.

Corresponding to circuit structure as shown in FIG. 6, a further reference is made to the following table:

| operation | a | b | c | storage functional pattern |
|---|---|---|---|---|
| read | high | pulse (low) | 0 potential | maintain |
| write | high | pulse (relatively high) | 0 potential | amorphous −> crystalline |
| erase | high | pulse (high) | 0 potential | crystalline −> amorphous |

Based on the above table, it can be seen that the second signal of this example may include at least three types of second signals: a first pulse signal for performing a writing function, a second pulse signal for performing a reading function, and a third pulse signal for performing an erasing function. The potential of the second pulse signal is lower than the potential of the first pulse signal, and the potential of the first pulse signal is lower than the potential of the third pulse signal.

The writing function, the reading function, and the erasing function of the storage elements may be realized by utilizing the above three types of second signals.

Further, when performing the above step 502, the method may include:

step 5021, for loading the first pulse signal to the second signal line when the link between the source electrode and the drain electrode of the storage element is turned on, such that the storage functional pattern is converted from the amorphous state to the crystalline state, thereby realizing the writing function of the storage functional pattern;

step 5022, for loading the second pulse signal to the second signal line when the link between the source electrode and the drain electrode of the storage element is turned on, such that the storage functional pattern is maintained in the crystalline state, thereby realizing the reading function of the storage functional pattern; and step 5023, for loading the third pulse signal to the second signal line when the link between the source electrode and the drain electrode of the storage element is turned on, such that the storage functional pattern is converted from the crystalline state to the amorphous state, thereby realizing the erasing function of the storage functional pattern.

Based on the above principle, it can be seen that the crystalline and amorphous states of the storage functional pattern may be used as the most basic binary voices "0" and "1" to realize direct recording and erasing of information. Therefore, during the storage functional pattern is maintained in the crystalline state, the information about the current in the third signal line when the third signal is loaded (or the resistance value equivalent expressed to the current) is the information stored in the storage functional pattern.

Figure 7:
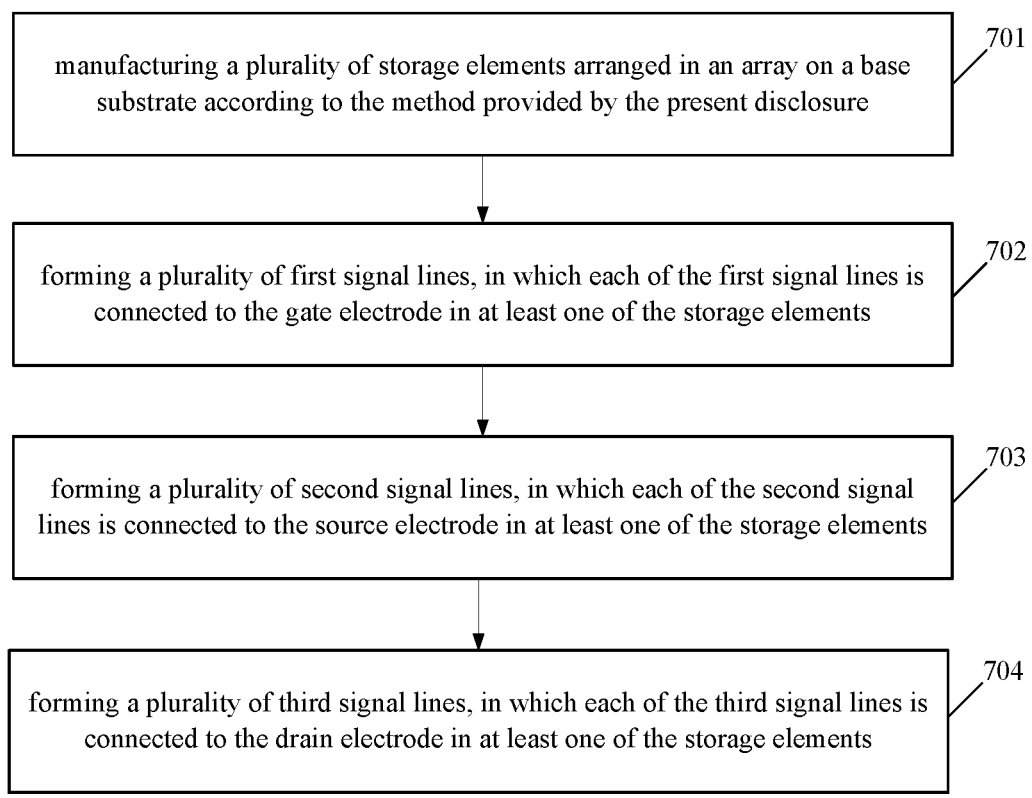
FIG. 7 is a flow chart of a method for manufacturing a storage device according to an embodiment of the present disclosure.

An example of the present disclosure further provides a method for manufacturing the above storage device, as shown in FIG. 7, which includes:

step 701, for manufacturing a plurality of storage elements arranged in an array on a base substrate according to the method provided by the example of the present disclosure;

step 702, for forming a plurality of first signal lines, in which each of the first signal lines is connected to the gate electrode in at least one of the storage elements;

step 703, for forming a plurality of second signal lines, in which each of the second signal lines is connected to the source electrode in at least one of the storage elements; and step 704, for forming a plurality of third signal lines, in which each of the third signal lines is connected to the drain electrode in at least one of the storage elements.

The manufacturing method of this example is used to manufacture the above-described storage device provided by the example of the present disclosure, and thus obviously, the technical effects of the storage device may also be achieved by the manufacturing method of this example.

The method for manufacturing the storage device of this example will be described in detail by way of example in combination with an application below.

Illustratively, taking the storage device including the storage element using a bottom-gate-type thin film transistor as an example, the manufacturing method of this example may include the following steps:

step B1, for providing a substrate;

step B2, for depositing a layer of a conductive material on the substrate and etching the conductive material by using a single patterning process to obtain a gate electrode and a first signal line;

step B3, for depositing a gate insulating layer;

step B4, for further forming an active layer on the gate insulating layer;

step B5, for depositing a conductive material on the active layer and etching the conductive material by using a single patterning process to obtain a source electrode, a drain electrode, and a second signal line, in which the second signal line is connected to the source electrode;

step B6, for forming an insulating layer having a via hole of submicron-scale, in which the via hole exposes the drain electrode;

step B7, for preparing a storage functional pattern on the insulating layer by using a phase change material, in which the storage functional pattern is connected to the drain electrode through the via hole of the insulating layer; and step B8, for depositing a layer of a conductive material on the active layer and etching the conductive material by using a single patterning process to obtain a third signal line connected to the storage functional pattern.

The above descriptions are exemplary embodiments of the present disclosure. It should be noted that one skilled in the art would make several improvements and modifications without departing from the principles of the present disclosure. These improvements and modifications should also be regarded as the protection scope of the present disclosure.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The word "including" and the like used in the present disclosure means that the element or item appeared in front of the word encompasses the element or item and their equivalents listed after the word, and does exclude other elements or items. In addition, the sequence numbers of the steps defined in the examples of the present disclosure do not indicate the execution sequence in the actual application.

What is claimed is:

1. A method for manufacturing a storage element, comprising steps of:
    providing a substrate;
    preparing a thin film transistor on the substrate; and
    preparing a storage functional pattern by using a phase change material, wherein the storage functional pattern is connected to a drain electrode of the thin film transistor,
    wherein the storage element, comprises:
    a thin film transistor comprising a source electrode, a drain electrode, and an insulating layer covering the source electrode and the drain electrode, the insulating layer having a via hole exposing the drain electrode; and
    a storage functional pattern formed of a phase change material, wherein the storage functional pattern is connected to a drain electrode of the thin film transistor through the via hole of the insulating layer, and the storage functional pattern comprises a part of the storage functional pattern formed in the via hole and being directly in physical contact with the drain electrode of the thin film transistor.

2. The method according to claim 1, wherein
    the step of preparing the thin film transistor on the substrate comprises:
    preparing a source electrode, a drain electrode, and an insulating layer, wherein the insulating layer has a via hole exposing the drain electrode, and a pore size of the via hole is of submicron-scale; and
    the step of preparing the storage functional pattern by using the phase change material comprises:
    preparing the storage functional pattern by using the phase change material after preparing the insulating layer.

3. The method according to claim 2, wherein the preparing the insulating layer having the via hole comprises:
    forming the insulating layer covering the source electrode and the drain electrode after preparing the source electrode and the drain electrode;
    forming a first functional layer on the insulating layer and etching the first functional layer to form a first transition via hole corresponding to the drain electrode;
    depositing a second functional layer covering the first transition via hole by vapor deposition, wherein a cavity is formed in an interior of a portion of the second functional layer covering the first transition via hole;
    etching the second functional layer to retain a portion of the second functional layer formed at an inner wall of the first transition via hole as an etch residual pattern, wherein the etch residual pattern comprises a second transition via hole exposing a portion of the insulating layer and corresponding to the drain electrode;
    etching the insulating layer by using the first functional layer and the etch residual pattern as a mask, to form the via hole exposing the drain electrode; and
    removing the first functional layer and the etch residual pattern.

4. The method according to claim 3, wherein the step of forming the first functional layer on the insulating layer and etching the first functional layer to form the first transition via hole corresponding to the drain electrode comprises:
    depositing a photosensitive resin material on the insulating layer to form the first functional layer, wherein a thickness of the first functional layer is 100 nm to 3000 nm; and
    exposing and developing the first functional layer to form the first transition via hole corresponding to the drain electrode, wherein a pore size of the first transition via hole is 1 μm to 3 μm.

5. The method according to claim 3, wherein the step of depositing the second functional layer covering the first transition via hole by vapor deposition comprises:
    depositing a polysilicon material by vapor deposition in a deposition rate of 50 nm/min to 200 nm/min at a temperature of 100° C. to 300° C. under a vacuum of 1 mPa to 1000 mPa, to form the second functional layer, wherein a thickness of the second functional layer is greater than or equal to 200 nm.

6. The manufacturing method according to claim 3, wherein the step of etching the second functional layer comprises:
    dry etching the second functional layer by using sulfur hexafluoride gas or chlorine gas to form the etch residual pattern having the second transition via hole of submicron-scale.

7. A storage element, comprising:
    a thin film transistor comprising a source electrode, a drain electrode, and an insulating layer covering the source electrode and the drain electrode, and the insulating layer having a via hole exposing the drain electrode; and a storage functional pattern formed of a phase change material, wherein the storage functional pattern is connected to a drain electrode of the thin film transistor through the via hole of the insulating layer, and the storage functional pattern comprises a part of the storage functional pattern formed in the via hole and being directly in physical contact with the drain electrode of the thin film transistor.

8. The storage element according to claim 7, wherein a pore size of the via hole is of submicron-scale.

9. The storage element according to claim 8, wherein a cross-sectional area of the via hole in a direction parallel to the insulating layer is less than or equal to 1 µm$^2$.

10. The storage element according to claim 7, wherein a thickness of the storage functional pattern is 100 nm to 1000 nm.

11. The storage element according to claim 7, wherein the phase change material is chalcogenide or vanadium oxide.

12. A storage device, comprising:
a plurality of storage elements according to claim 7 arranged in an array;
a plurality of first signal lines, wherein each of the first signal lines is connected to the gate electrode of the thin film transistor in at least one of the storage elements;
a plurality of second signal lines, wherein each of the second signal lines is connected to the source electrode of the thin film transistor in at least one of the storage elements;
a plurality of third signal lines, wherein each of the third signal lines is connected to the storage functional pattern in at least one of the storage elements; and
a controller configured to load signals to the plurality of first signal lines, the plurality of second signal lines, and the plurality of third signal lines and to acquire information about a current in the plurality of third signal lines.

13. The storage device according to claim 12, wherein a pore size of the via hole is of submicron-scale.

14. The storage device according to claim 12, wherein the phase change material is chalcogenide or vanadium oxide.

15. A method for manufacturing a storage device, comprising:
manufacturing a plurality of storage elements arranged in an array on a base substrate according to the method of claim 1;
forming a plurality of first signal lines, wherein each of the first signal lines is connected to the gate electrode in at least one of the storage elements;
forming a plurality of second signal lines, wherein each of the second signal lines is connected to the source electrode in at least one of the storage elements; and
forming a plurality of third signal lines, wherein each of the third signal lines is connected to the storage functional pattern in at least one of the storage elements.

16. The method for manufacturing a storage device according to claim 15, wherein in the manufacturing of the plurality of storage elements, the step of preparing the thin film transistor on the substrate comprises:

preparing the source electrode, the drain electrode, and an insulating layer covering the source electrode and the drain electrode of the thin film transistor on the substrate; and
the step of preparing the storage functional pattern by using a phase change material comprises:
preparing the storage functional pattern by using the phase change material after forming the insulating layer.

17. A method for driving a storage device using the storage device according to claim 12, comprising:
loading a first signal to the first signal line, to turn on a link between the source electrode and the drain electrode of the storage element corresponding to the first signal line;
loading a second signal to the second signal line, such that the second signal flows from the source electrode of the storage element corresponding to the second signal line to the storage functional pattern connected to the drain electrode of the corresponding storage element, to allow the storage functional pattern to have one of the following phenomena: a conversion from an amorphous state to a crystalline state, a maintenance of the crystalline state, and a conversion from the crystalline state to the amorphous state; and
loading a third signal to the third signal line, to acquire information about a current in the third signal line when the third signal is loaded, and to acquire information stored in the storage functional pattern based on the information about the current in the third signal line.

18. The method according to claim 17, wherein a pore size of the via hole is of submicron-scale.

19. The method according to claim 17, wherein the second signal comprises a first pulse signal, a second pulse signal and a third pulse signal, and the step of loading the second signal to the second signal line comprises:
loading the first pulse signal to the second signal line when the link between the source electrode and the drain electrode of the storage element is turned on, to convert the storage functional pattern from the amorphous state to the crystalline state, and to realize a writing function of the storage functional pattern;
loading the second pulse signal to the second signal line when the link between the source electrode and the drain electrode of the storage element is turned on, to maintain the storage functional pattern in the crystalline state, and to realize a reading function of the storage functional pattern; and
loading the third pulse signal to the second signal line when the link between the source electrode and the drain electrode of the storage element is turned on, to convert the storage functional pattern from the crystalline state to the amorphous state, and to realize an erasing function of the storage functional pattern;
wherein a potential of the second pulse signal is lower than a potential of the first pulse signal, and the potential of the first pulse signal is lower than a potential of the third pulse signal.

20. The method according to claim 19, wherein during the storage functional pattern is maintained in the crystalline state, the information about the current in the third signal line when the third signal loaded is the information stored in the storage functional pattern.

* * * * *